US008908748B2

(12) United States Patent
Buchner et al.

(10) Patent No.: US 8,908,748 B2
(45) Date of Patent: Dec. 9, 2014

(54) INTERFACE CIRCUIT AND METHOD FOR ENABLING AN OUTPUT DRIVER OF THE INTERFACE CIRCUIT

(71) Applicant: Infineon Technologies AG, Neubiberg (DE)

(72) Inventors: Klaus Buchner, Steyregg (AT); Klemens Kordik, Linz (AT); Christian Unhold, Linz (AT)

(*) Notice: Subject to any disclaimer, the term of this patent is extended or adjusted under 35 U.S.C. 154(b) by 32 days.

(21) Appl. No.: 13/651,559

(22) Filed: Oct. 15, 2012

(65) Prior Publication Data
US 2013/0094559 A1    Apr. 18, 2013

(30) Foreign Application Priority Data
Oct. 14, 2011 (DE) .......................... 10 2011 084 509

(51) Int. Cl.
*H04B 1/38* (2006.01)
*G06F 13/40* (2006.01)
*H04L 29/10* (2006.01)
*G11C 16/10* (2006.01)
*G06F 13/42* (2006.01)

(52) U.S. Cl.
CPC ............ *H04L 29/10* (2013.01); *G06F 13/4072* (2013.01); *G11C 16/10* (2013.01); *G06F 13/4291* (2013.01)

USPC ....... 375/220; 370/359; 370/419; 379/399.01

(58) Field of Classification Search
CPC .............. H04B 1/00; H04B 3/00; H04B 7/00; H04B 14/00; H04B 17/00; H04B 2001/00; H04B 2201/00; H04J 13/00; H04J 2013/00; H03K 7/00; H03K 9/00; H03L 7/00; H04L 1/00; H04L 5/00; H04L 7/00; H04L 25/00; H04L 27/00; H04L 2001/00; H04L 2007/00; H04L 2025/00; H04L 2027/00; H03M 5/00
See application file for complete search history.

(56) References Cited
U.S. PATENT DOCUMENTS
8,271,810 B1 * 9/2012 Fliesler et al. ............... 713/300
* cited by examiner

*Primary Examiner* — Adolf Dsouza

(57) ABSTRACT

An interface circuit includes an interface terminal, a voltage detection device, an output driver and an enable logic. The interface terminal is configured to connect to an interface line. The voltage detection device is configured to detect a voltage present at the interface terminal. The output driver is configured to apply an output signal to the interface terminal. The enable logic is configured to generate an enable signal for the output driver based on an evaluation signal output by the voltage detection device, wherein the enable signal affects an enabling of the output driver if the evaluation signal shows that the voltage present at the interface terminal meets a given condition.

26 Claims, 7 Drawing Sheets

INTERFACE CIRCUIT AND METHOD FOR ENABLING AN OUTPUT DRIVER OF THE INTERFACE CIRCUIT

REFERENCE TO RELATED APPLICATION

This Application claims priority to German Application number 102011084509.7 filed on Oct. 14, 2011.

SUMMARY

Embodiments of the present invention create an interface circuit for communication with a communication partner as can be used, for example, in order to connect various electronic assemblies or components to one another. Further embodiments of the present invention create a communication system, a method for enabling an output driver of an interface circuit and a method for enabling an output mode of an interface.

An electronic system often comprises a number of assemblies, subunits or components which have to communicate with one another so that the electronic system can fulfill its intended task. Especially when the assemblies to be connected are digital circuits, bus systems can be used, for example. An example of such a bus system is the so-called "Serial Peripheral Interface" (SPI) which has been developed by Motorola. SPI uses a synchronous serial databus by means of which digital circuits can be connected to one another in accordance with the master-slave principle. A similar bus system exists by National Semiconductor and is called "Microwire". Many microcontrollers allow in-system programming (abbreviated ISP) over the SPI bus or the Microwire interface. It should be noted that the SPI standard and the Microwire interface are only meant to be examples and that the technical teachings disclosed herein can also be applied in conjunction with other interfaces.

When two communication devices are connected to one another via an electrical connection for the purpose of communication (for example for conveying data (data communication), control signals (signal communication or control communication), memory addresses (address communication), digital signals, analog signals, etc.), at least the components connected directly to the electrical connection form an electrical circuit. The electrical currents and voltages prevailing in this common circuit may accordingly be influenced by both communication devices. It is particularly when one of the communication devices is deenergized or has a defect that there can be unwanted circuit conditions which may damage one of the communication devices or the electrical connection between the communication devices. Occasionally, it also occurs that some assemblies or subunits of an electronic circuit are selectively switched to be temporarily de-energized in order to reduce the power consumption.

In one embodiment the present invention protects an interface circuit with regard to unusual, unwanted and/or even damaging circuit conditions, wherein the unusual, unwanted and/or damaging circuit conditions occur outside the interface circuit. An alternative or additional object relates to the provision of a diagnostic capability which supplies a diagnostic result even when the connection (e.g. a databus) is defective.

Embodiments of the present invention create an interface circuit which comprises an interface terminal, a voltage detection device, an output driver and an enable logic. The interface terminal is configured to connect to an interface line for communication with a communication partner. The voltage detection device is configured to detect a voltage present at the interface terminal. The output driver is configured to apply an output signal to the interface terminal for purposes of communication. The enable logic is configured to generate an enable signal for the output driver based on an evaluation signal output by the voltage detection device, wherein the enable signal affects an enabling of the output driver if the comparison signal shows that the voltage present at the interface terminal meets a given condition.

According to the technical teaching disclosed, it can be determined by means of the voltage present at the interface terminal whether a part of the circuit formed by the interface line and the communication partner is configured in a manner suitable for the communication. In this case, the voltage present at the interface terminal meets the given condition mentioned. In order to ensure that the voltage detection device functions properly, a relatively weak signal is sufficient which loads the interface circuit only slightly. Nevertheless, this weak signal, which can also be considered as a test signal, has a similar effect as an active signal which is generated by the interface for the purposes of communication. In the case of a misconfiguration of the interface line and/or of the communication partner, in particular, this weak signal causes a similar response of the voltage present at the interface terminal as the active signal. The weak test signal can be generated in various ways, some of which will be described further below. The interface circuit according to the technical teaching disclosed thus provides for prior testing of the interface line and/or of the communication partner with regard to their electrical characteristics to be carried out.

Further embodiments of the technical teaching disclosed create an interface circuit which comprises an interface terminal, a standard-level generating circuit, a checking circuit and an enable circuit. The interface terminal is configured to connect to an interface line for communication with a communication partner. The standard-level generating circuit is configured to hold a standard level at the interface terminal when no active signal is present at the latter. The checking circuit is configured to test whether a current level at the interface terminal is within a tolerance range with respect to the standard level and output a corresponding test result. The enable circuit is configured to receive the test result and enable an output mode of the interface when the current level is within the tolerance range and the interface circuit does not apply an active signal to the interface terminal.

Further embodiments of the disclosed technical teaching create a communication system which comprises a first communication device, a second communication device and an electrical connection between the first communication device and the second communication device. At least the first communication device is configured to determine an electrical characteristic of a circuit which comprises the electrical connection and the second communication device by applying a weak signal level to the electrical connection and by evaluating a voltage resulting at or on the electrical connections. The first communication device is also configured to enable communication from the first communication device to the second communication device when the voltage resulting at or on the electrical connection meets a given condition.

Further embodiments of the technical teaching disclosed create a method for enabling an output driver of an interface circuit. The method comprises evaluating a voltage present at an interface terminal and generating a corresponding evaluation signal. The interface terminal forms a connection to an interface data line for communication with a communication partner of the interface circuit. The method also comprises testing whether the evaluation signal signals that the voltage present at the interface terminal meets a given condition.

According to the method, an enable signal for the output driver of the interface circuit is generated when the testing has shown that the voltage present at the interface terminal meets the given condition.

Further embodiments of the technical teaching disclosed create a method for enabling an output mode of an interface. The interface comprises an interface terminal which is configured to connect to an interface line for communication with a communication partner. The method for enabling the output mode comprises holding a standard level at the interface terminal when no active signal is present at the latter, and testing whether a current level at the interface terminal is within a tolerance range with respect to the standard level. Furthermore, the method comprises generating a corresponding test result and enabling the output mode of the interface when the current level is within the tolerance range and the interface circuit does not apply an active signal to the interface terminal.

BRIEF DESCRIPTION OF THE DRAWINGS

Exemplary embodiments of the present invention will be described in greater detail in the text which follows, with reference to the attached figures, in which.

DETAILED DESCRIPTION

Before explaining embodiments with reference to the attached figures in the text which follows, it is pointed out that identical elements or elements of identical function are provided with the same reference symbols or similar reference symbols and that a repeated description of these elements may be omitted. Descriptions of elements having identical or similar reference symbols are therefore mutually exchangeable. Furthermore, optional features of the various exemplary embodiments can be combined with one another or exchanged against one another.

Figure 1:
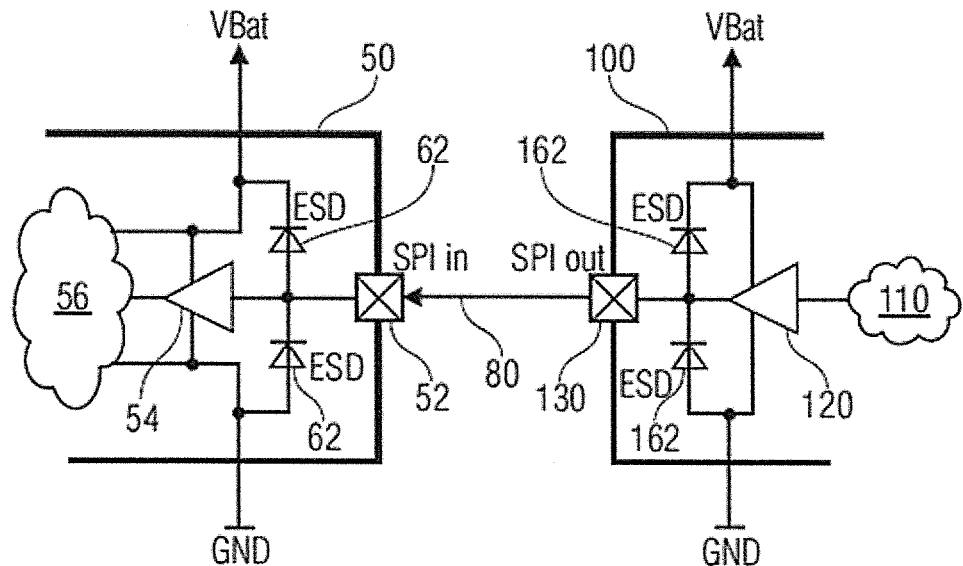
FIG. 1 shows a schematic circuit diagram of two communication devices and a connection without special provisions for testing the connection.
Figure 2:
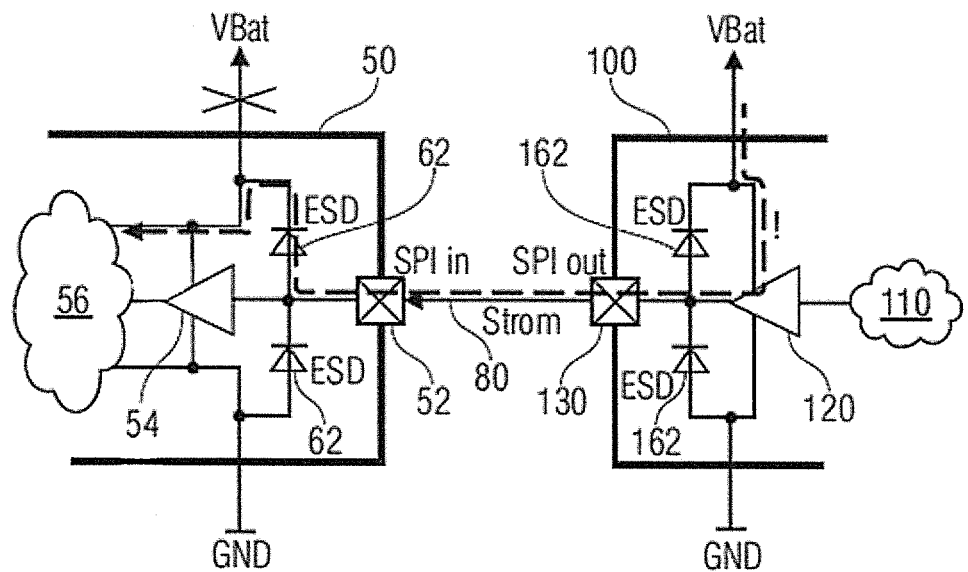
FIG. 2 shows a schematic circuit diagram similar to FIG. 1, but where an unwanted circuit condition is present in one of the two communication devices.

FIGS. 1 and 2 represent a communication between two interfaces 50 and 100 diagrammatically as a circuit diagram.

FIG. 1 here shows a normal operation and FIG. 2 shows a fault operation. The interface 100 is configured as an output interface and is thus used for transmitting data to the interface 50 which is configured as an input interface. Thus, a unidirectional communication is carried out from the output interface 100 to the input interface 50. In principle, however, it would also be conceivable that both interfaces 50, 100 can be configured both for an input operation and an output mode and have the components required for this. A unidirectional communication is shown in favor of a simplified representation since this is sufficient for the purposes of explaining the technical teaching disclosed herein.

The interface 100 is connected at this input to a network 110 not specified in greater detail and a signal provided by the network 110 is supplied to an input of an output driver 120. The output driver 120 is connected to a supply voltage VBat and to a ground potential GND. The output driver 120 converts the signal coming from the network 110 into an output signal which is suitable for transmission to the second interface 50. The output driver 120 can be, for example, an amplifier, an impedance converter or a voltage follower. The output driver 120 is connected at its output to an interface terminal 130 which is designated by "SPI out" in FIG. 1 and is thus designed for communication with other SPI-compatible interfaces. As mentioned above, the SPI standard is only used as an example so that other standards or also proprietary interface specifications can also be used at this point.

The interface terminal 130 is connected to an interface terminal 52 of the interface circuit 50 via an electrical connection 80. The interface terminal 52 is designated by "SPI in" in FIG. 1. Within the interface circuit 50, the interface terminal 52 is connected to an input of a buffer 54 which is configured for processing, for example amplifying, the signal transmitted on the electrical connection 80 for further processing within the interface circuit 50 or a circuit connected thereto. The signal processed in this manner is transferred from an output of the buffer or input buffer 54 to a network 56, not specified in greater detail. The input buffer 54 is connected to a supply voltage VBat and a ground potential GND. The ground potentials of the interfaces 50 and 100 are in most cases connected to one another electrically in order to provide a common reference potential for the signal transmitted on the electrical connection 80. The supply voltage VBat of the interface circuit 50 can, but does not have to be the same as the supply voltage VBat of the interface circuit 100.

In the normal operation shown in FIG. 1, the electrical connection 80 is typically at an electrical potential which is between the ground potential GND and the supply potential VBat. As protection for components of the interface circuit 100, e.g. the output driver 120, against electrostatic discharge which could pass, e.g., via the interface terminal 130 into the interface circuit 100, the interface circuit 100 has protective devices 162. In the interface circuit 100 shown in FIG. 1, reverse-biased diodes 162 are used as protective devices against electrostatic discharge. The diodes 162 are characterized as a rule by a rapid response time in order to cope with the rapid rise times of typical electrostatic discharges. The interface circuit 50 also comprises reverse-biased diodes 62 as protective devices against electrostatic discharge. During a regular operation of the interface circuit 50, 100, the diodes 62, 162 are non-conductive. If, however, a potential which is outside the range limited by the supply potential VBat and the ground potential GND by more than the forward voltage of one of the diodes 62 or 162 is present on the electrical connection 80 due to an electrostatic discharge, this potential will discharge either via one or both diodes 62, 162 connected to the supply potential VBat, or via one or both of the diodes 62, 162 connected to the ground potential GND.

FIG. 2 shows the arrangement of FIG. 1 wherein, however, the interface circuit 50 is no longer connected to the supply voltage VBat which can be caused either by intentional interruption of the voltage supply of the interface circuit 50 or by an unintentional defect. If then the output driver 120 of the interface circuit 100 attempts to pull the electrical connection 80 approximately to the supply potential VBat, the upper protective diode 62 can become conductive within the interface circuit 50 since the input buffer 54 and/or the network 56 can have low-impedance connections to ground potential GND due to the missing supply potential. Thus, a low-impedance connection can be produced between the supply potential VBat of the interface circuit 100 and the ground potential GND of the interface circuit 50 via the output driver 120, the interface terminals 130 and 52, the electrical connection 80, the upper protective diode 62 and, for example, the input buffer 54. On a conduction path or current path formed in this manner, a relatively high current can flow which can damage the output driver 120 and/or the input buffer 54 of the interface circuits 100 and 50, respectively.

If thus a connected SPI slave device to which the interface circuit 50 belongs is separated from the voltage supply and an SPI communication between a device comprising the interface circuit 100 and the connected SPI slave device is started, the digital SPI output line of the interface 100 actively drives a device not supplied with voltage. Via the integrated ESD protection circuit, the interface circuit 50 supplies its supply terminal with current (unintentional supply of the interface circuit 50 and possibly further parts of the communication partner connected). Since there can be a relatively large power consumption via the supply terminal of the interface circuit 50 and of the network 56, this leads to a relatively large current flow via the output driver 120 and the electrical connection 80.

The output current peak of the interface 100 can exceed the specified absolute maximum nominal value since it may not be designed for providing protection against a short circuit to ground lines on communication interfaces. As a result, the component may become damaged (especially on the side of the interface 100) or there may be an inadmissible voltage drop in the supply voltage. Possible causes of this can be application errors (e.g. a lack or missing of a component on power up ("power up component missing")) or an interrupted supply voltage connection in a component to which the interface 50 belongs. Thus, FIG. 2 shows a conflict state in which the component on the side of the interface 50 is separated from the voltage supply.

Figure 3:
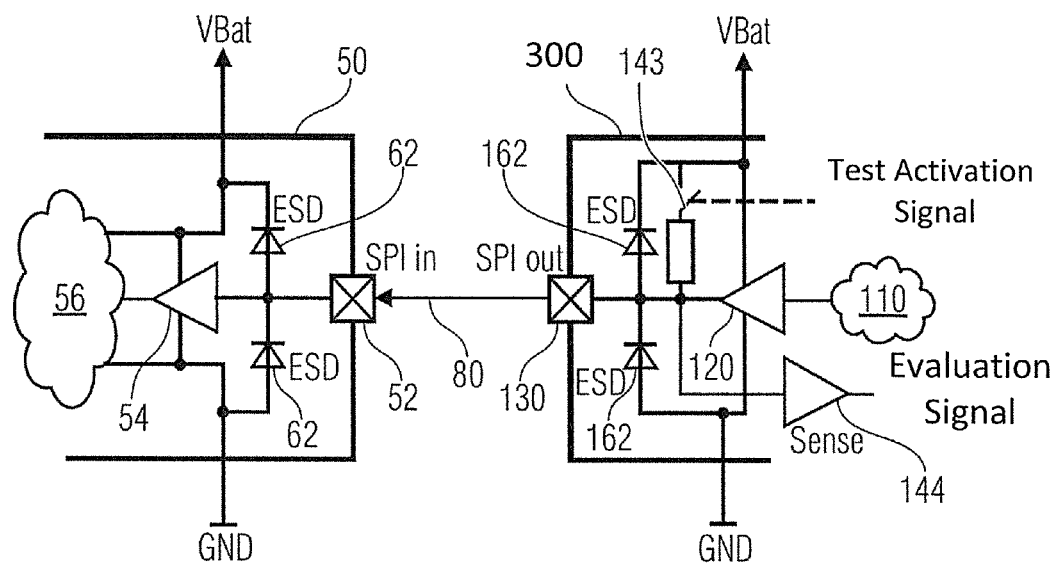
FIG. 3 shows a schematic circuit diagram of a first communication device, a second communication device and a connection, wherein the first communication device is arranged in accordance with an embodiment of the technical teaching disclosed.

FIG. 3 shows a schematic circuit diagram of an interface connection between the interface 50, already known from FIGS. 1 and 2, as input interface and an interface 300 according to at least one embodiment of the technical teachings disclosed as the output interface. The interface 300 comprises a pull-up resistor 142, a switch 143 and a voltage detection device 144.

A series circuit comprising the pull-up resistor 142 and the switch 143 connects the interface terminal 130 electrically to a first electrical potential, in this case to the supply potential VBat. The switch 143 is controlled via a test activation signal which activates the resistor 142, for example before the communication from the interface 300 to the interface 50 at the receiver end is started. In this manner, the resistor 142 pulls the voltage present at interface terminal 130 essentially to the first potential VBat when the interface terminal 130 is otherwise essentially floating. The term "floating" means that the interface terminal 130 is at an electrical potential which cannot be determined in advance or is not defined since in certain operating conditions both the signal output of the output driver 120 and the signal input of the input buffer 54 have a very high impedance and the interface terminal 130 is thus essentially decoupled from defined potentials such as the supply potential VBat and the ground potential GND. The same applies to the electrical connection 80 and the interface terminal 52 of the input interface 50. The literature occasionally also contains the term "zero-potential" for describing a node which is floating with respect to the electrical potential. The resistor 142 cancels this floating state and pulls the electrical potential of the interface terminal 130 to the supply potential VBat if this effect is not overlaid by a stronger influence of another component such as the output driver 120. In particular, the output driver 120 can selectively apply an electrical potential at its signal output during a communication operation which is between the ground potential GND and the supply potential VBat. As a rule, the resistor 142 is dimensioned in such a manner that only a slight electrical current flows through it which is smaller than an electrical current output by the output driver 120.

By means of the selective activation of the resistor 142 by means of the switch 143 it is possible to avoid, in the case of an intentional power down of the opposite party (i.e. the interface 50), a constant shunt current flow. As soon as communication has begun and active levels are driven on this line, the resistor 142 can be deactivated by opening the switch 143 in order again to avoid shunt currents. The switch 143 thus enables the bus state (state of the connection or of the communication partner) to be tested immediately before it is enabled for communication while the bus has a high impedance in the idle state or, in the case of communication, the level on the bus is determined by the active driver. Please note that the switch 143 is representative of arbitrary switching elements, for example, transistors.

It should be pointed out in this connection that the interfaces 50 and 300 can also be bidirectional interfaces. Correspondingly, the interface 50 would also have an output driver, the signal output of which is connected to the interface terminal 52. The interface 300, in turn, would have an input buffer, the signal input of which is connected to the interface terminal 130. In this bidirectional case, an active signal can also be present at the interface terminal 130 if a data transmission takes place from the interface 50 via the electrical connection 80 back to the interface 300.

The voltage detection device 144 is configured to detect a voltage present at the interface terminal. It is possible to select as an electrical reference potential for the voltage detection device 144, e.g., the ground potential GND, but other reference potentials are also possible. In this manner, a relationship can be established between the voltage detected by the voltage detection device 144 and the electrical potential present at the interface terminal 130. The voltage detection device 144 outputs an evaluation signal which is supplied to an enable logic (not shown in FIG. 3). The enable logic is configured to generate an enable signal for the output driver 120 based on the evaluation signal, which enables the output driver 120 when the evaluation signal shows that the voltage present at the interface terminal 130 meets a given condition (e.g. a predetermined condition).

The given condition can specify, for example, whether the voltage present at the interface terminal 130 is higher or lower than a threshold value. If neither the output driver 120 nor any output driver of the interface 50 which may be present applies an active signal to the interface terminal 130, the electrical potential at the interface terminal 130 is essentially determined by a voltage divider to which the resistor 142 also belongs. A second part or branch of the voltage divider is formed by variable connections from the interface terminal 130 to the ground potential GND which have a very high impedance or are virtually non-conductive in normal operation (FIG. 1), but can become to have a relatively low impedance in the case of a fault (FIG. 2). The (imagined) voltage divider then extends from the supply voltage VBat via the resistor 142, the interface terminal 130 and the high-impedance or low-impedance connection to the ground potential GND. A detection input of the voltage detection device 144 is connected to the interface terminal 130 and thus to a central node of the (imagined) voltage divider so that a considerable effect on the voltage present at the interface terminal is produced, depending on whether the connection between the interface terminal 130 and the ground potential GND has a high impedance or low impedance, if no active signal is present at the interface terminal 130. By means of a comparison of the voltage present at the interface terminal 130 with the threshold value it is possible to determine whether the given condition is met which, in turn, allows the assumption that no unwanted short circuit is present between the communication line and the ground potential either on the electrical connection 80 or within the interface 50 or within the communication partner (indicated by the network 56).

According to the technical teaching disclosed herein, the communication line is tested with a weak level (e.g. a weak logic level) before any communication is begun.

If there is no communication via the SPI interface, the SPI interface lines are kept in a standard state or default state. The standard state is a floating state in the embodiment shown in FIG. 3. Shortly before a communication to be started, the connection is tested for which purpose the SPI interface line is kept at a logical "high" state. This keeping of the SPI interface line(s) is achieved by an integrated pull-up resistor 142 (the level is accordingly not generated actively, i.e. the level is not generated by, e.g., the output driver 120). It is non-critical to keep the line(s) in a weak state since this is static (no fast timing is needed as during the communication).

When the SPI communication is started, the first step is to check the (weak) default state of the line. This can be done, e.g., via a small digital hardware or digital circuit.

The SPI output line is monitored according to one embodiment as follows:
a) The pull-up resistor 142 is connected by means of the switch 143 to the electrical potential VBat which is controlled via a test activation signal which closes the switch 143. In this manner, the pull-up resistor 142 pulls the interface terminal 130 to the electrical potential VBat if there is no defect on the interface line or at the communication partner.
b) If the line 80, 130 is at the logical "high" state, it can be assumed that the communication partner is active and communication is started.
c) If the line 80, 130 is at the logical "low" state, it must be assumed that the communication partner is turned off or there is a ground short. In this case, it holds true that currents limited by the resistor 142, which are sent via the electrical connection 80 to the communication partner, cannot raise the SPI line to a logical "high" state and the fault state thus remains detectable. However, the pull-up resistor 142 limits the current to non-critical values. Communication is not started and a fault code is possibly conveyed to the user (e.g. a customer who has acquired the interface circuit 300). Accordingly, a voltage value, detected by the voltage detection device 144, of the voltage present at the interface terminal 130 can indicate a possible short circuit on the interface data line 80 or within communication partners connected to the interface data line 80. This information can then be used for the decision whether or not the output driver 120 is to be enabled.

The voltage detection device 144 can be configured, in particular, for testing the voltage present at the interface terminal 130 with a weak logic level.

In one embodiment the voltage detection device 144 can comprise a comparator which is configured for comparing the voltage present at the interface terminal with the threshold value, wherein the evaluation signal specifies whether the voltage present at the interface terminal 130 is higher or lower than the threshold value. In another embodiment, the voltage detection device 144 can comprise an analog/digital converter. The evaluation signal is in this case a digital signal. The aforementioned comparator, too, can be considered to be a one-bit analog/digital converter.

In principle, the interface 300 can be an analog circuit or a digital circuit. If the interface circuit 300 is a digital circuit, the output signal can represent at least a first logic state and a second state.

The combination of the interfaces 50, 300 and the interface line 80 is typically a part of a communication system. The communication system comprises a first communication device and a second communication device. The first communication device comprises the interface circuit 300 and the second communication device comprises the interface circuit 50. The interface line 80 forms an electrical connection between the first communication device and the second communication device. At least the first communication device is configured to determine an electrical characteristic of a circuit, which comprises the electrical connection and the second communication device, by applying a weak signal level to the electrical connection 80 and by evaluating a voltage resulting on the electrical connection 80. The first communication device is also configured to enable a communication from the first communication device to the second communication device when the voltage resulting on the electrical connection 80 meets a given condition. From the point of view of the first communication device, the electrical connection or interface line 80 and the second communication device form a circuit which can also be depicted in the form of an equivalent circuit. This circuit also represents an electrical load for a real voltage source which is formed by the supply potential VBat and the resistor 142. The electrical characteristic to be determined by the communication device 300 is, for example, the input impedance of the circuit which comprises the electrical connection 80 and the second communication device. In the case of a correct operation, i.e. when there is no ground short, this impedance is relatively large. The impedance value may also fluctuate more or less around a relatively large value also in normal operation, depending on the switching state of the second communication device.

The technical teachings disclosed herein can be used generally in electronic circuits, microcontrollers etc. for fault protection on digital interfaces which require an actively driven logic level. An interface circuit according to the technical teaching disclosed is also suitable for providing a simple/additional diagnostics capability for connected devices which themselves do not offer any or offer only slight self-testing capabilities (e.g. an SPI sensor), if a read-back and plausibility check of the value read must be performed now (i.e. immediately or instantaneously).

Figure 4:
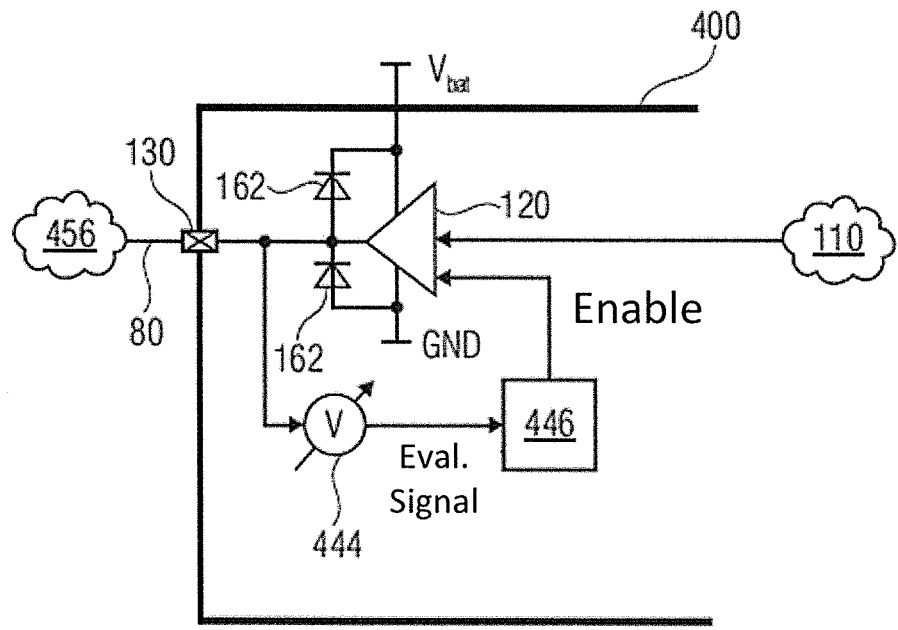
FIG. 4 shows a schematic block diagram of an interface circuit according to a further embodiment of the technical teaching disclosed.

FIG. 4 shows a schematic circuit diagram of an interface circuit 400 according to a further embodiment of the technical teaching disclosed. The voltage detection device 444 is here represented as a general measuring device. The evaluation signal output by the voltage detection device 444 is conveyed to the enable logic 446 which uses the evaluation signal for generating the enable signal for the output driver 120. The enable signal can force, e.g., a so-called tri-state condition of the output driver 120 as long as the enable logic 446 does not allow the output mode of the interface 400 due to the situation found on the interface line 80 or in the communication partner (indicated by the network 456). The enable signal output by the enable logic 446 can be, e.g., ANDed with an operating mode signal which controls whether the interface 400 is inactive or is to work in an input mode or an output mode.

Figure 5:
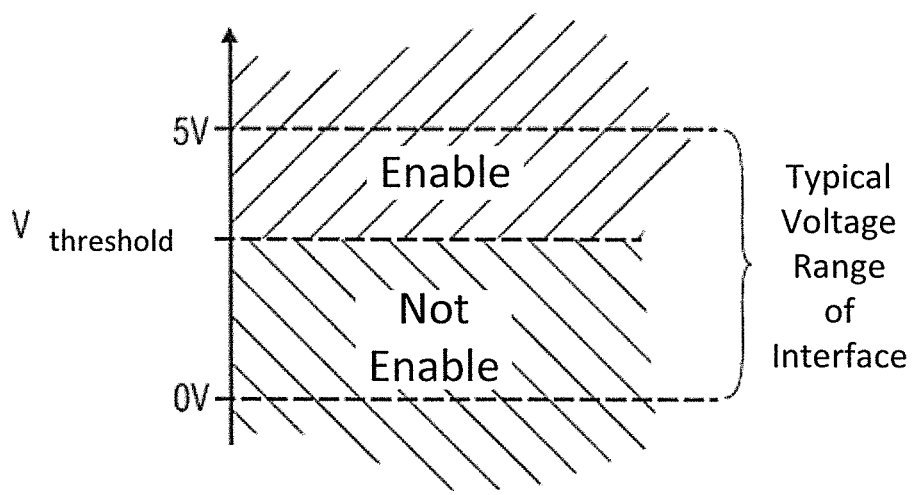
FIG. 5 shows a diagrammatic representation of voltage ranges for illustrating an enable condition for an output driver of the interface circuit according to embodiments of the technical teaching disclosed.

FIG. 5 shows diagrammatically two voltage ranges of the voltage present at the interface terminal 130 which determine whether the output driver 120 is enabled or not. It is assumed that the voltage at the interface terminal 130 can assume a value which lies within a typical voltage range of the interface. This typical voltage range is specified from 0 V to 5 V in FIG. 5, which is to be understood to be an example. If the voltage at interface terminal 130 is above a value $V_{threshold}$, it can be assumed that there is no ground short on the interface line 80 or the communication partner having the interface 50. This value $V_{threshold}$ can be, e.g., approximately 3 V as shown in FIG. 5. In the voltage range designated by "enable", the voltage at interface terminal 130 thus meets the given condition. If, however, the voltage present at interface terminal 130 is below the value $V_{threshold}$, the given condition is not met and there is no enable. This is because, in this case, it must be expected that a not negligible current flows via the resistor 142 which leads to a corresponding voltage drop across the resistor 142. This leads to the assumption of a ground short between the interface line 80 and the ground potential GND.

Figure 6:
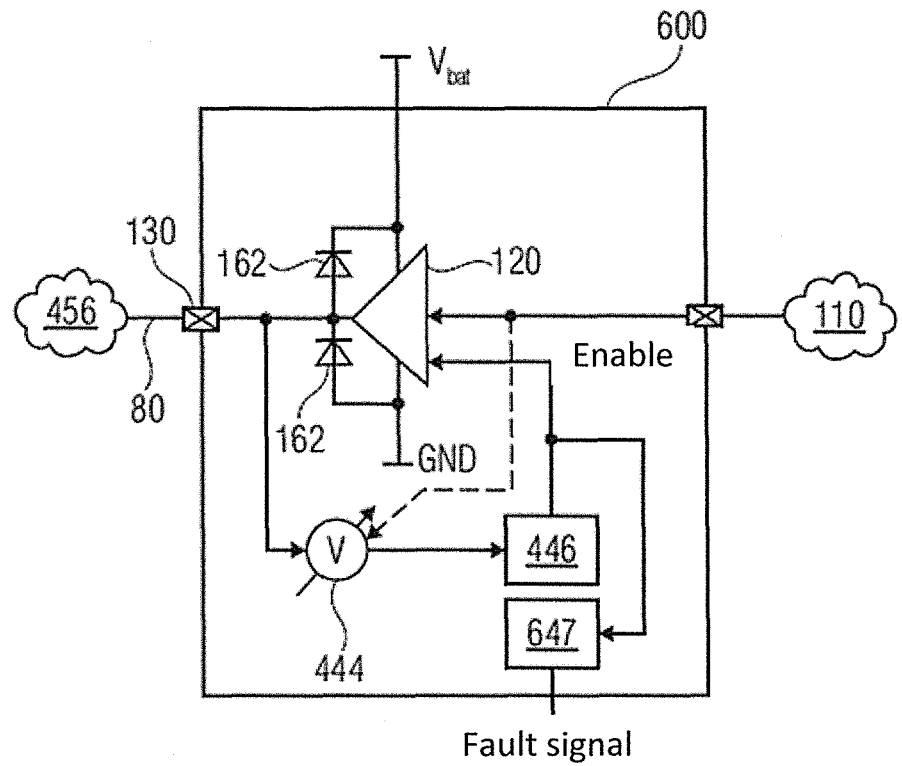
FIG. 6 shows a schematic block diagram of an interface circuit according to a further embodiment of the technical teaching disclosed.

FIG. 6 shows a schematic circuit diagram of an interface circuit 600 according to a further embodiment of the technical teaching disclosed. In addition to the elements contained by the interface circuit 400 of FIG. 4, the interface circuit 600 also comprises a fault signal circuit 647. The fault signal circuit 647 is configured to generate a fault signal based on the enable signal when an expected enable of the output driver by the enable logic 446 does not occur. The fault signal can be output by the interface 600 to a user or a fault handling device so that further measures for eliminating the fault can be carried out in one embodiment. Since it is especially in the case of a lacking voltage supply of the communication partner that a self-diagnosis of the communication partner also fails, as a rule, the fault signal generated by the interface 600 can supply valuable information about the location and the type of the fault. The reason for this is that the fault also affects the interface 600, especially the voltage present at the interface terminal 130 even if the cause of the fault is found within the communication partner or its voltage supply.

Although not shown in FIG. 6, the fault signal circuit 647 can have further inputs in order to receive, e.g., an operating mode signal. By evaluating the enable signal and possibly other signals, the fault signal circuit 647 can determine whether the symptoms for a fault are present. The fault signal can contain more detailed information relating to the type of and cause of the fault in one embodiment.

In order to provide for a check during the communication (an "emergency stop", as it were, if the logic state to be generated by the output driver cannot be generated), the voltage detection device 444 can check whether a nominal state which is present at the input of the output driver 120 is also actually output in the intended manner at the interface terminal 130. An optional connection from the input of the output driver 120 to the voltage detection device 444 (shown dashed in FIG. 6) is used for conveying the nominal state to the voltage detection device 444.

Figure 7:
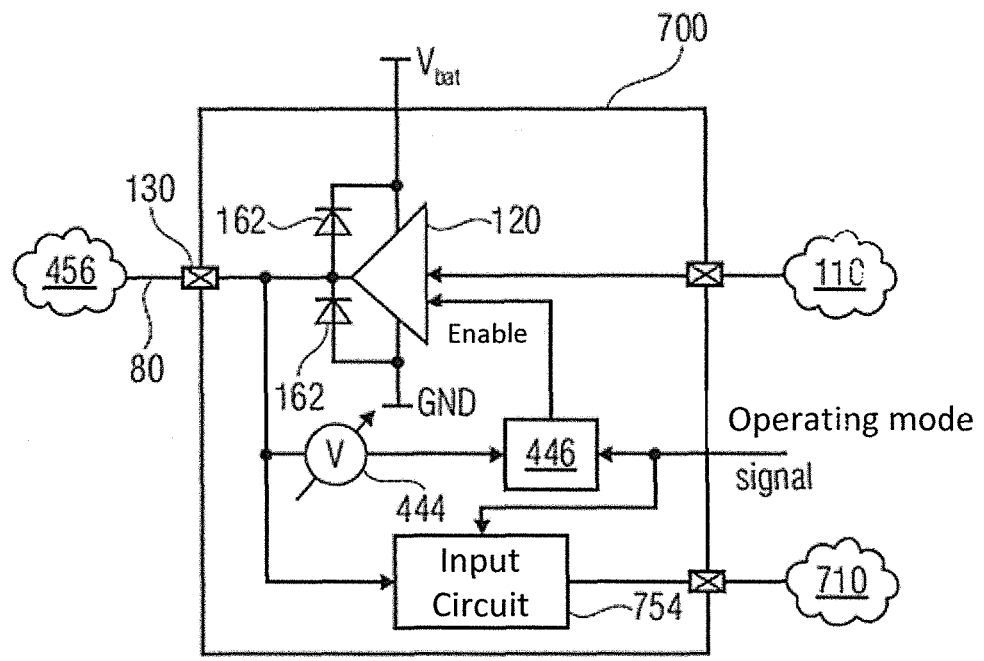
FIG. 7 shows a schematic block diagram of an interface circuit according to a further embodiment of the technical teaching disclosed.

FIG. 7 shows a schematic circuit diagram/block diagram of an interface circuit 700 according to yet a further embodiment of the technical teaching disclosed. The enable logic 446 comprises in this case an input for an operating mode signal. The operating mode signal specifies whether the interface circuit is to operate in input mode or output mode at a particular time. The enable logic 446 is also configured to test a possible enable of the output driver 120 (i.e. at a particular time or in a particular situation) when the operating mode signal signals a switch-over to an output mode. If the enabling of the output driver 120 is successful, the enable logic 446 holds the enable signal until the operating mode signal signals an end of the output mode. In this manner, the enabling of the output driver 120 is tested only at particular times or under certain conditions, namely before the output driver 120 is activated, if, therefore, the system switches from an input mode to the output mode.

The interface circuit 700 also comprises an input circuit 754 which has a signal input connected to the interface terminal 130. The input circuit 754 can be constructed essentially similar to the interface circuit 50 from FIGS. 1 to 3, i.e. an input buffer. The input circuit 754 also has an input for the operating mode signal so that the input circuit 754 is switched to be active when the operating mode signal indicates an input mode of the interface circuit 700. An output of the input circuit 754 is connected to a network 710 not specified in greater detail, in which the signal received via the interface line 80 is processed further.

Figure 8:
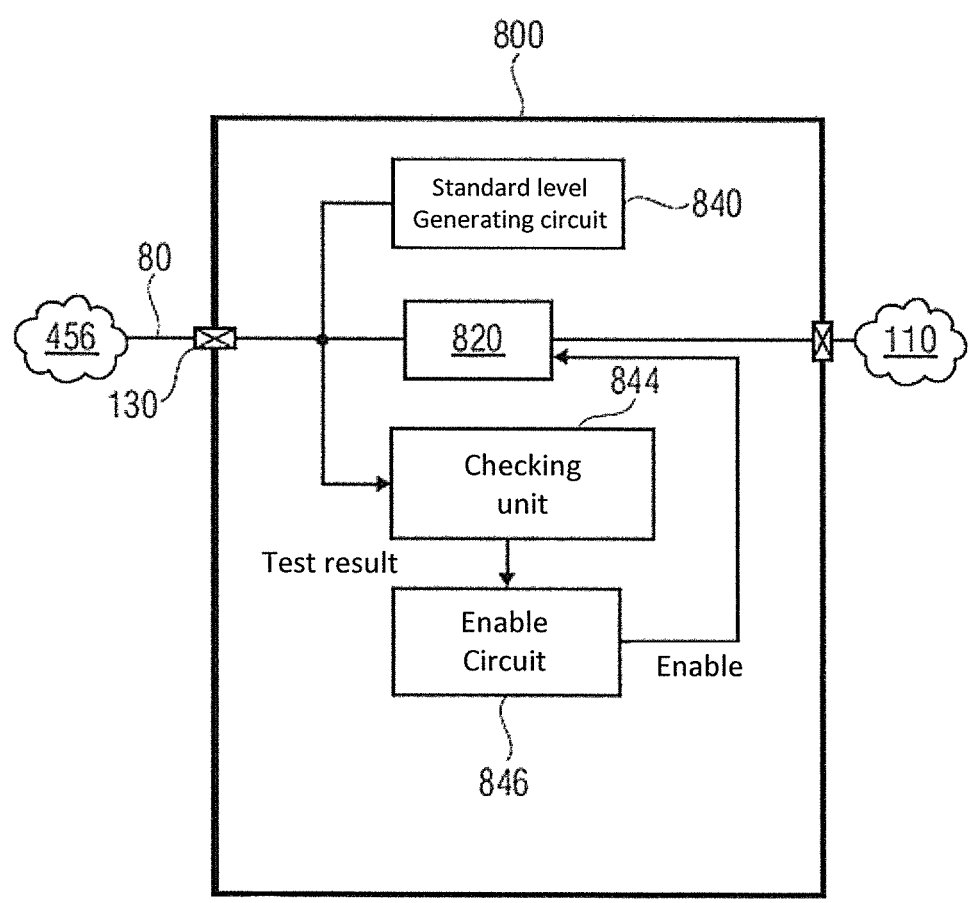
FIG. 8 shows a schematic block diagram of an interface circuit according to yet a further embodiment of the technical teaching disclosed.

FIG. 8 shows a schematic block diagram of an interface circuit 800 according to a further embodiment of the technical teaching disclosed. The interface circuit 800 comprises the interface terminal 130, an output driver 820, a standard-level generator 840, a checking circuit 844 and an enable circuit 846.

The standard-level generating circuit 840 is configured to hold a standard level at the interface terminal 130 when no active signal is present at the latter. As explained above, the term "active signal" relates to a signal which is applied by the output driver 820 to the interface terminal 130 or is applied via the interface line 80 from a communication partner within the network 456 to the interface terminal 130. The standard level or default level, respectively, can be a logic level, a voltage level, a current level or a further type of level. The standard-level generator 840 is as a rule relatively "elastic" so that the load connected to an output of the standard-level generating circuit 840 has a great influence on the signal output by the standard-level generating circuit 840 (e.g. the voltage present at the interface terminal 130). The standard-level generating circuit can be considered, e.g., as a real voltage source with a relatively high internal impedance. Correspondingly, the standard-level generator is capable of holding the standard level only under certain load conditions. It is especially this dependence on the load condition which can be used in the interface circuits according to the technical teaching disclosed. If the standard-level generating circuit 840 is configured as a real voltage source with a high internal impedance, this high internal impedance also limits the current output by the standard-level generating circuit 840 which is desirable in many cases for limiting a current consumption of the interface circuit 800 and thus loading of the voltage supply. Furthermore, the testing of the interface line and of the communication partner is carried out only at particular times and under certain conditions, for example before a communication is started in the direction of the communication partner.

The checking circuit 844 is configured to test whether a current level at the interface terminal 130 is within a tolerance range with respect to the standard level. Furthermore, the checking circuit 844 is configured to output a corresponding test result when the current level is within the tolerance range with respect to the standard level. Referring to FIG. 5, the standard level can be, e.g., approximately 4.5 volts. The tolerance range with respect to this standard level would be the range open towards the top above the threshold value $V_{thresh\text{-}old} \approx 3$ V according to the representation of FIG. 5. Other tolerance ranges, especially narrower tolerance ranges around the standard level are also conceivable. The tolerance range can extend symmetrically around the standard level but does not have to.

The enable circuit 846 is configured to receive the test result and enable an output mode of the interface 800 when the current level is within the tolerance range and the interface circuit does not apply an active signal to the interface terminal 130. It is to be noted that the actual activation of the output mode of the interface 800, as a rule, depends not only on the enable signal but also on an operating mode signal which is generated, e.g., within the network 110. On the other hand, an output mode of the interface 800 is typically not possible when the enable signal does not indicate an enable for the output driver 820.

Figure 9:
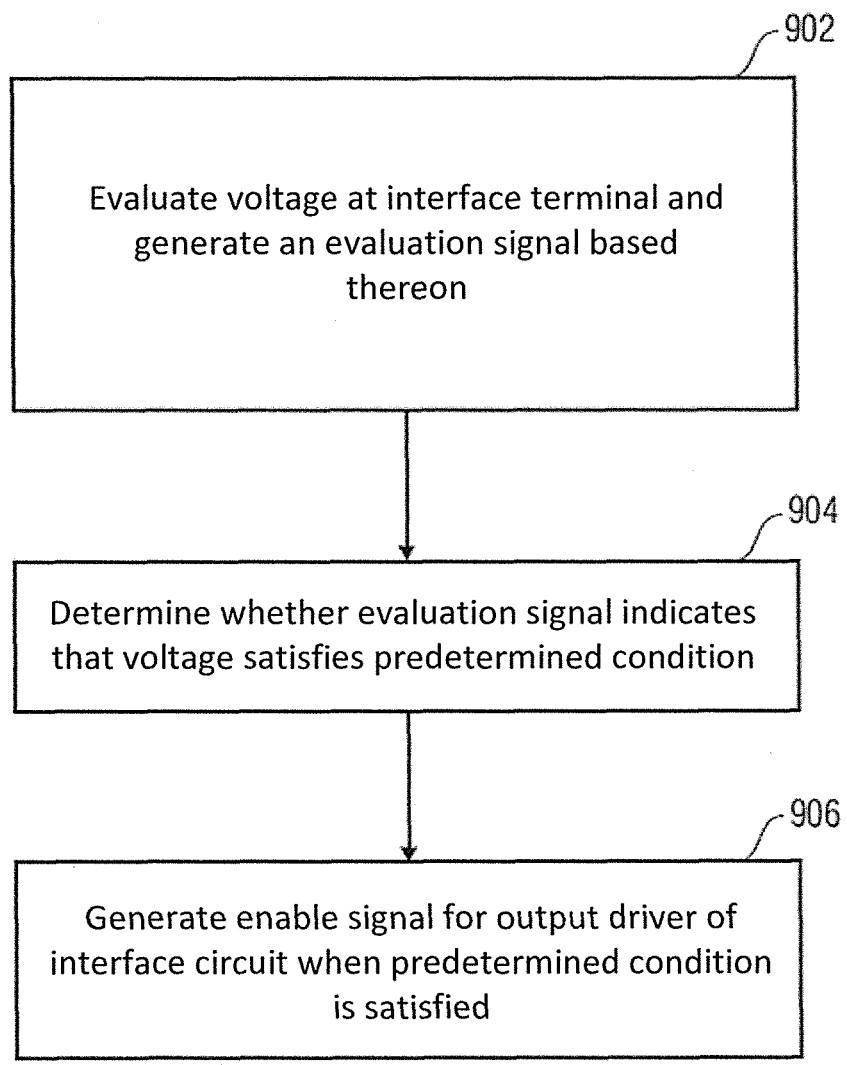
FIG. 9 shows a schematic flow chart of a method according to an embodiment of the technical teaching disclosed.

FIG. 9 shows a diagrammatic flow chart of a method for enabling an output driver of an interface circuit. The method comprises evaluating a voltage present at an interface terminal and generating a corresponding evaluation signal as can be seen at 902. The interface terminal forms a connection to an interface data line for communication with a communication partner of the interface circuit.

At 904, it is then checked whether the evaluation signal indicates that the voltage present at the interface terminal meets a given condition. The given condition can be met, for example, when the voltage present at the interface terminal is within a particular voltage range.

The method for enabling an output driver of an interface circuit also comprises at 906 generating an enable signal for the output driver of the interface circuit when the testing has shown that the voltage present at the interface terminal meets the given condition.

The method can also comprise comparing of the voltage present at the interface terminal with a threshold value in order to obtain a corresponding comparison result. The evaluation signal can then be generated based on the result of the comparison which specifies whether the voltage present at the interface terminal is higher or lower than the threshold value.

The voltage present at the interface terminal can be pulled essentially to a first electrical potential by means of a resistor, e.g. a pull-up resistor or pull-down resistor, when the interface terminal is otherwise essentially floating. The resistor can connect the interface terminal electrically to the first potential.

The evaluation signal can be a digital signal and the generating of the evaluation signal can comprise an analog/digital conversion in one embodiment.

The method can also comprise testing whether an expected enabling of the output driver is missing. If necessary, a fault signal can be generated based on the expected, but lacking enable signal in the context of the method.

The method can also comprise receiving an output mode activation command. The output mode activation command can be provided, for example, via an operating mode signal.

When the output mode activation command has been received, the step of evaluating the voltage present at the interface terminal, the step of testing and the step of generating the enable signal for the output driver can be carried out conditionally. The enable signal for the output driver can be held in this case until a command ending the output mode is received.

Certain voltage values of the voltage present at the interface terminal can point to a possible short circuit on the interface data line or within a communication partner connected to the interface data line.

The voltage present at the interface terminal can be detected by applying a weak logic level to the interface terminal.

Figure 10:
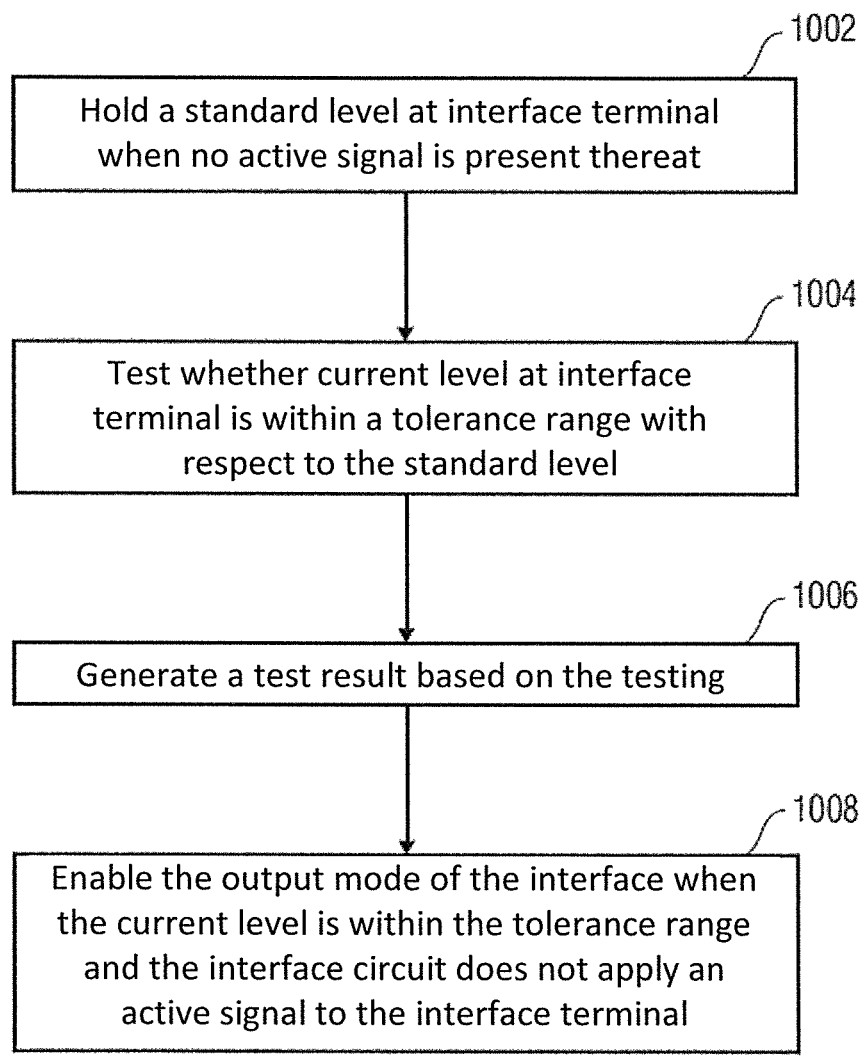
FIG. 10 shows a schematic flow chart of a method according to a further embodiment of the technical teaching disclosed.

FIG. 10 shows a diagrammatic flow chart of a method for enabling an output mode of an interface. The interface comprises an interface terminal which is configured to connect to an interface line for communication with a communication partner. The method comprises at 1002 holding a standard level at the interface terminal when no active signal is present at the latter. The standard level can be, e.g., a weak logic level. The method also comprises testing whether a current level at the interface terminal lies within a tolerance range with respect to the standard level as indicated at 1004. It should be pointed out that the current level can quite easily deviate from the standard level, especially when an active signal is present at the interface terminal. In this sense, a low-impedance ground connection or a low-impedance connection to another electrical potential can also be considered to be an active signal. Based on the testing of the current level at 1004, a corresponding test result is generated at 1006.

At 1008, the output mode of the interface is enabled when the current level is within the tolerance range and the interface circuit does not apply an active signal to the interface terminal.

In order to keep an overall energy budget of an application or of an electronic circuit within a predetermined frame, a number of customers or users of such systems demand a so-called "duty cycling" of certain components. Within the context of duty cycling, this component or these components are temporarily turned off in inactive phases (i.e. decoupled from the voltage supply). This is frequently performed by an application controller such as, e.g., a microcontroller, so that the components linked directly via an SPI connection meet zero-voltage or not voltage-supplied communication partners in these inactive phases without this being known to the component(s) linked via the SPI connection.

The technical teaching disclosed herein can be used in such systems in order to protect the various components and interfaces and the output drivers contained therein against ground shorts which may occur in connected communication partners when these are decoupled from the voltage supply.

The technical teachings disclosed herein are of interest to many types of electronic systems and can be used generally in electronic circuits, microcontrollers etc. for a) fault protection on digital interfaces which require an actively driven logic level and b) providing a simple/additional diagnostics capability for connected devices which themselves do not offer any or offer only slight self-testing capabilities (e.g. an SPI sensor) when a read-back and plausibility check of the value read has to be carried out now (i.e. immediately or instantaneously).

Although many aspects have been described in conjunction with a device, it is understood that these aspects also represent a description of the corresponding method so that a block or a component of a device is also understood to be a corresponding method step or a feature of a method step. Analogously, aspects which have been described in conjunction with a or as a method step also represent a description of a corresponding block or detail or feature of a corresponding device.

The exemplary embodiments described above represent only an illustration of the principles of the present invention. Naturally, modifications and variations of the arrangements and details described herein will be clear to other experts. It is intended, therefore, that the invention be restricted only by the protective cover of the following patent claims and not by the specific details which have been presented herein by means of the description and the explanation of the exemplary embodiments.

What is claimed is:

1. An interface circuit, comprising:
    an interface terminal configured to connect to an interface line for communication with a communication partner;
    a voltage detection device configured to detect a voltage present at the interface terminal;
    an output driver configured to apply an output signal to the interface terminal for purposes of communication; and
    an enable logic configured to generate an enable signal for the output driver based on an evaluation signal output by the voltage detection device, wherein the enable signal effects an enabling of the output driver if the evaluation signal shows that the voltage present at the interface terminal meets a given condition.

2. The interface circuit as claimed in claim 1, further comprising a resistor which connects the interface terminal electrically to a first electrical potential so that the resistor pulls the voltage present at the interface terminal to the first potential when the interface terminal is otherwise floating.

3. The interface circuit as claimed in claim 2, wherein the resistor comprises a high-impedance resistor.

4. The interface circuit as claimed in claim 1, wherein the given condition specifies whether the voltage present at the interface terminal is higher or lower than a threshold value.

5. The interface circuit as claimed in claim 4, wherein the voltage detection device comprises a comparator configured to compare the voltage present at the interface terminal with the threshold value, wherein the evaluation signal specifies whether the voltage present at the interface terminal is higher or lower than the threshold value.

6. The interface circuit as claimed in claim 1, wherein the voltage detection device comprises an analog/digital converter and wherein the evaluation signal is a digital signal.

7. The interface circuit as claimed in claim 1, wherein the interface circuit is a digital circuit and wherein the output signal can represent at least one first logic state and one second state.

8. The interface circuit as claimed in claim 1, further comprising a fault signal circuit configured to generate a fault signal based on the enable signal if an expected enabling of the output driver by the enable logic fails to occur.

9. The interface circuit as claimed in claim 1, wherein the interface circuit is configured to switch between an input mode and an output mode and wherein the enable logic is configured to check the enabling of the output driver when the circuit switches from the input mode to the output mode.

10. The interface circuit as claimed in claim 9, wherein the enable logic comprises an input for an operating mode signal which specifies at least whether the interface circuit operates in the input mode or in the output mode at a particular time, wherein the enable logic is also configured to check a possible enabling of the output driver when the operating mode signal signals a switch-over to the output mode and in the case of a successful enabling holding the enable signal until the operating mode signal signals an end of the output mode.

11. The interface circuit as claimed in claim 1, wherein the voltage detection device is configured to test the voltage present at the interface terminal with a weak logic level.

12. The interface circuit as claimed in claim 1, wherein a voltage value, detected by the voltage detection device, of the voltage present at the interface terminal indicates a possible short circuit on the interface line or within the communication partner connected to the interface line.

13. An interface circuit comprising:
    an interface terminal downstream of an output driver, wherein the interface terminal is configured to connect to an interface line for communication with a communication partner;
    a standard-level generating circuit configured to hold a standard level at the interface terminal when no active signal is present there at;
    a checking circuit configured to test whether a current level at the interface terminal is within a tolerance range with respect to the standard level and outputting a corresponding test result;
    an enable circuit configured receive the test result and enabling an output mode of the interface when the current level is within the tolerance range and the interface circuit does not apply an active signal to the interface terminal.

14. The interface circuit as claimed in claim 13, wherein the standard level provided by the standard-level generating circuit is a weak logic level which collapses when the interface terminal is connected at low impedance to a level deviating from the standard level.

15. A communication system comprising:
    a first communication device and a second communication device;
    an electrical connection between the first communication device and the second communication device;
    wherein at least the first communication device is configured to determine an electrical characteristic of a circuit which comprises the electrical connection and the second communication device by applying a weak signal level to the electrical connection and by evaluating a voltage resulting on the electrical connection, and enable communication from the first communication device to the second communication device when the voltage resulting on the electrical connection meets a given condition.

16. The communication system as claimed in claim 15, wherein the first communication device comprises an interface circuit that comprises:
    an interface terminal configured to connect to an interface line for communication with a communication partner;
    a voltage detection device configured to detect a voltage present at the interface terminal;
    an output driver configured to apply an output signal to the interface terminal for purposes of communication; and
    an enable logic configured to generate an enable signal for the output driver based on an evaluation signal output by the voltage detection device, wherein the enable signal effects an enabling of the output driver if the evaluation signal shows that the voltage present at the interface terminal meets a given condition.

17. A method for enabling an output driver of an interface circuit, the method comprising:
    evaluating a voltage present at an interface terminal and generating a corresponding evaluation signal based thereon, wherein the interface terminal forms a connection to an interface data line for communication with a communication partner of the interface circuit;

testing whether the evaluation signal indicates that the voltage present at the interface terminal meets a given condition;

generating an enable signal for the output driver of the interface circuit when the testing has shown that the voltage present at the interface terminal meets the given condition.

18. The method as claimed in claim 17, wherein the voltage present at the interface terminal is pulled to a first potential by means of a resistor when the interface terminal is otherwise floating, wherein the resistor connects the interface terminal electrically to the first potential.

19. The method as claimed in claim 17, further comprising:
comparing the voltage present at the interface terminal with a threshold value in order to obtain a corresponding comparison result;
generating the evaluation signal based on the comparison result which specifies whether the voltage present at the interface terminal is higher or lower than the threshold value.

20. The method as claimed in claim 17, wherein the evaluation signal is a digital signal and the generating of the evaluation signal comprises an analog/digital conversion.

21. The method as claimed in claim 17, further comprising:
testing whether an expected enabling of the output driver fails to occur; and
selectively generating a fault signal based on the lacking enable signal.

22. The method as claimed in claims 17, further comprising:
receiving an output mode activation command; and
conditionally evaluating the voltage present at the interface terminal, and testing and generating the enable signal for the output driver, when an output mode activation command has been received.

23. The method as claimed in claim 22, further comprising:
Holding the enable signal for the output driver until the reception of a command ending the output mode.

24. The method as claimed in claim 17, wherein a detected voltage value of the voltage present at the interface terminal indicates a possible short circuit on the interface line or within a communication partner connected to the interface line.

25. The method as claimed in claim 17, wherein detecting the voltage present at the interface terminal comprises applying a weak logic level to the interface terminal.

26. A method for enabling an output mode of an interface with an interface terminal downstream of an output driver, wherein the interface terminal is configured to connect to an interface line for communication with a communication partner, comprising:
holding a standard level at the interface terminal when no active signal is present there at;
testing whether a current level at the interface terminal is within a tolerance range with respect to the standard level;
generating a corresponding test result in response to the testing; and
enabling the output mode of the interface when the current level is within the tolerance range and the interface circuit does not apply an active signal to the interface terminal.

* * * * *